(12) United States Patent
Bothe et al.

(10) Patent No.: US 12,408,403 B2
(45) Date of Patent: Sep. 2, 2025

(54) FIELD EFFECT TRANSISTOR WITH STACKED UNIT SUBCELL STRUCTURE

(71) Applicant: MACOM Technology Solutions Holdings, Inc., Lowell, MA (US)

(72) Inventors: Kyle Bothe, Cary, NC (US); Jia Guo, New Hill, NC (US); Yueying Liu, Cary, NC (US); Jeremy Fisher, Raleigh, NC (US); Scott T. Sheppard, Chapel Hill, NC (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 603 days.

(21) Appl. No.: 17/848,984

(22) Filed: Jun. 24, 2022

(65) Prior Publication Data

US 2022/0328634 A1    Oct. 13, 2022

Related U.S. Application Data

(63) Continuation-in-part of application No. 17/325,576, filed on May 20, 2021, now Pat. No. 11,658,234,
(Continued)

(51) Int. Cl.
*H10D 62/85*    (2025.01)
*H10D 30/47*    (2025.01)
(Continued)

(52) U.S. Cl.
CPC ....... *H10D 62/8503* (2025.01); *H10D 30/475* (2025.01); *H10D 62/149* (2025.01);
(Continued)

(58) Field of Classification Search
CPC ............. H10D 62/8503; H10D 62/149; H10D 30/471; H10D 30/475; H10D 64/111;
(Continued)

(56) References Cited

U.S. PATENT DOCUMENTS 6,849,882 B2    2/2005    Chavarkar et al.
7,126,426 B2    10/2006   Mishra et al.
(Continued)

FOREIGN PATENT DOCUMENTS

CN    108565283 A        9/2018
CN    113035943 A    *   6/2021
(Continued)

OTHER PUBLICATIONS

International Search Report and Written Opinion of the International Searching Authority, PCT/US2022/030233, mailed Sep. 2, 2022, 10 pages.
(Continued)

*Primary Examiner* — Joseph C. Nicely
(74) *Attorney, Agent, or Firm* — Sage Patent Group

(57) ABSTRACT

A transistor device includes a first unit subcell including having a first active region width extending in a first direction, and a second unit subcell having a second active region width extending in the first direction and arranged adjacent the first unit subcell in the first direction. The first unit subcell and the second unit subcell share a common drain contact and have separate gate contacts that are aligned in the first direction. Each unit subcell includes a field plate that is connected to a source contact outside the active region and that does not cross over the gate contact.

31 Claims, 8 Drawing Sheets

Related U.S. Application Data which is a continuation-in-part of application No. 17/081,476, filed on Oct. 27, 2020, now Pat. No. 11,502,178.

(51) Int. Cl.
  *H10D 62/13* (2025.01)
  *H10D 64/00* (2025.01)
  *H10D 64/27* (2025.01)

(52) U.S. Cl.
  CPC ......... *H10D 64/111* (2025.01); *H10D 64/112* (2025.01); *H10D 64/411* (2025.01); *H10D 64/518* (2025.01)

(58) Field of Classification Search
  CPC .. H10D 64/112; H10D 64/411; H10D 64/518; H10D 64/519; H01L 29/2003; H01L 29/7786; H01L 29/778; H01L 29/402; H01L 29/404; H01L 29/0843; H01L 29/42316; H01L 29/42376; H01L 29/4238
  See application file for complete search history.

(56) References Cited

U.S. PATENT DOCUMENTS

| | | | |
|---|---|---|---|
| 7,230,284 B2 | 6/2007 | Parikh et al. | |
| 7,419,892 B2 | 9/2008 | Sheppard et al. | |
| 7,501,669 B2 | 3/2009 | Parikh et al. | |
| 7,550,783 B2 | 6/2009 | Wu et al. | |
| 7,573,078 B2 | 8/2009 | Wu et al. | |
| 7,875,537 B2 | 1/2011 | Suvorov et al. | |
| 8,823,057 B2 | 9/2014 | Sheppard et al. | |
| 8,872,190 B1 * | 10/2014 | Young ................. | H01L 23/4821 257/77 |
| 9,318,594 B2 | 4/2016 | Sheppard et al. | |
| 9,711,633 B2 | 7/2017 | Sheppard et al. | |
| 9,847,411 B2 | 12/2017 | Sriram et al. | |
| 9,984,881 B2 | 5/2018 | Sheppard et al. | |
| 10,692,998 B2 | 6/2020 | Fayed et al. | |
| 10,892,356 B2 | 1/2021 | Sriram et al. | |
| 10,971,612 B2 | 4/2021 | Bothe et al. | |
| 2005/0253167 A1 | 11/2005 | Wu et al. | |
| 2006/0202272 A1 * | 9/2006 | Wu ...................... | H10D 64/112 257/E29.253 |
| 2008/0073670 A1 | 3/2008 | Yang et al. | |
| 2008/0128752 A1 | 6/2008 | Wu | |
| 2009/0230429 A1 * | 9/2009 | Miyamoto .......... | H10D 64/112 257/192 |
| 2010/0276698 A1 | 11/2010 | Moore et al. | |
| 2012/0049973 A1 | 3/2012 | Smith, Jr. et al. | |
| 2012/0194276 A1 | 8/2012 | Fisher | |
| 2013/0134482 A1 | 5/2013 | Yu et al. | |
| 2013/0193485 A1 * | 8/2013 | Akiyama ............. | H10D 30/475 257/194 |
| 2013/0221364 A1 | 8/2013 | Yu et al. | |
| 2013/0228789 A1 | 9/2013 | Yamamura | |
| 2014/0001478 A1 | 1/2014 | Saunier et al. | |
| 2014/0361341 A1 | 12/2014 | Sriram et al. | |
| 2014/0361342 A1 * | 12/2014 | Sriram ................. | H10D 64/117 257/194 |
| 2015/0014631 A1 * | 1/2015 | Ohlsson ............ | H01L 21/30612 438/507 |
| 2016/0359035 A1 | 12/2016 | Yu et al. | |
| 2020/0027956 A1 | 1/2020 | Aoki | |
| 2020/0312968 A1 * | 10/2020 | Kasahara ............... | H10D 62/83 |
| 2020/0395475 A1 * | 12/2020 | Bothe .................. | H10D 30/475 |
| 2021/0013314 A1 | 1/2021 | Hu et al. | |
| 2022/0130965 A1 * | 4/2022 | Bothe .................... | H10D 30/47 |
| 2022/0130966 A1 * | 4/2022 | Bothe .................. | H10D 64/111 |
| 2022/0130985 A1 | 4/2022 | Bothe et al. | |
| 2022/0223700 A1 * | 7/2022 | Bothe ................ | H10D 62/8503 |
| 2022/0302271 A1 | 9/2022 | Trang et al. | |
| 2022/0367106 A1 | 11/2022 | Lee et al. | |
| 2022/0376085 A1 | 11/2022 | Bothe et al. | |
| 2022/0376098 A1 | 11/2022 | Lee et al. | |
| 2022/0376099 A1 | 11/2022 | Bothe et al. | |
| 2022/0376104 A1 | 11/2022 | Bisges et al. | |
| 2022/0376105 A1 | 11/2022 | Guo et al. | |
| 2022/0406925 A1 * | 12/2022 | Jacquet ................ | H10D 30/475 |

FOREIGN PATENT DOCUMENTS

| | | | | |
|---|---|---|---|---|
| JP | H11274174 A | | 10/1999 | |
| JP | 2000269235 A | | 9/2000 | |
| JP | 2013157407 A | | 8/2013 | |
| JP | 2014045069 A | | 3/2014 | |
| JP | 2020161553 A | * | 10/2020 | ......... H01L 29/0692 |
| KR | 20080108486 A | | 12/2008 | |
| TW | 201426883 A | * | 7/2014 | ............. H01L 21/18 |
| WO | WO-2007126541 A1 | * | 11/2007 | ........... H01L 29/404 |

OTHER PUBLICATIONS

Extended European Search Report for EP Application No. 21887389.1 mailed Sep. 9, 2024, 7 pages.

First Japanese Office Action dated Apr. 2, 2024 for Japanese Patent Application No. JP 2023-525472, 6 pages (including English translation).

* cited by examiner

FIELD EFFECT TRANSISTOR WITH STACKED UNIT SUBCELL STRUCTURE

CROSS-REFERENCE TO RELATED APPLICATIONS

The present application is a continuation-in-part of U.S. application Ser. No. 17/325,576, entitled "FIELD EFFECT TRANSISTOR WITH ENHANCED RELIABILITY," filed May 20, 2021, and U.S. application Ser. No. 17/081,476, entitled "FIELD EFFECT TRANSISTOR WITH AT LEAST PARTIALLY RECESSED FIELD PLATE," filed Oct. 27, 2020, the disclosures of which are incorporated herein by reference in its entirety.

BACKGROUND

The present disclosure relates to transistor structures and in particular to field effect transistor devices having unit cell arrangements including field plates.

Narrow bandgap semiconductor materials, such as silicon (Si) and gallium arsenide (GaAs), are widely used in semiconductor devices for low power and, in the case of Si, low frequency applications. However, these semiconductor materials may not be well-suited for high power and/or high frequency applications, for example, due to their relatively small bandgaps (1.12 eV for Si and 1.42 for GaAs at room temperature) and relatively small breakdown voltages.

Interest in high power, high temperature and/or high frequency applications and devices has focused on wide bandgap semiconductor materials such as silicon carbide (3.2 eV for 4H-SiC at room temperature) and the Group III nitrides (e.g., 3.36 eV for GaN at room temperature). These materials may have higher electric field breakdown strengths and higher electron saturation velocities than GaAs and Si.

A device of particular interest for high power and/or high frequency applications is the High Electron Mobility Transistor (HEMT), which is also known as a modulation doped field effect transistor (MODFET). In a HEMT device, a two-dimensional electron gas (2DEG) may be formed at the heterojunction of two semiconductor materials with different bandgap energies, where the smaller bandgap material has a higher electron affinity than the wider bandgap material. The 2DEG is an accumulation layer in the undoped smaller bandgap material and can contain a relatively high sheet electron concentration, for example, in excess of $10^{13}$ carriers/cm$^2$. Additionally, electrons that originate in the wider bandgap semiconductor may transfer to the 2DEG, allowing a relatively high electron mobility due to reduced ionized impurity scattering. This combination of relatively high carrier concentration and carrier mobility can give the HEMT a relatively large transconductance and may provide a performance advantage over metal-semiconductor field effect transistors (MESFETS) for high-frequency applications.

HEMTs fabricated in the gallium nitride/aluminum gallium nitride (GaN/AlGaN) material system can generate large amounts of RF power due to a combination of material characteristics, such as relatively high breakdown fields, relatively wide bandgaps, relatively large conduction band offset, and/or relatively high saturated electron drift velocity. A major portion of the electrons in the 2DEG may be attributed to polarization in the AlGaN.

Field plates have been used to enhance the performance of GaN-based HEMTs at microwave frequencies and have exhibited performance improvement over devices without field plates. Many field plate approaches have involved a field plate connected to the source of the transistor with the field plate on top of the drain side of a channel. This can result in a reduction of the electric field on the gate-to-drain side of the transistor, thereby increasing breakdown voltage and reducing the high-field trapping effect. However, some transistors with gate-to-drain field plates can exhibit relatively poor reliability performance, particularly at class C (or higher class) operation where the electric field on the source side of the gate becomes significant.

FIG. 1 shows a GaN-based HEMT 10 formed on a silicon carbide substrate 12. A GaN channel layer 16 is on the substrate 12, and an AlGaN barrier layer 18 is on the channel layer 16. A 2DEG 20 arises in the channel layer 16 adjacent the barrier layer 18. A source contact 22 and a drain contact 24 are formed on the channel layer 16. The conductivity of the 2DEG 20 is modulated by applying a voltage to a gate 26 that is formed on the barrier layer 18 between the source contact 22 and the drain contact 24. As shown in FIG. 1, the gate 26 may have a mushroom or T-top configuration in which the gate 26 contacts the barrier layer 18 in a relative narrow contact region that extends through a surface dielectric layer 25.

The HEMT 10 includes a field plate 28 that is connected to the source contact 22. The field plate 28 is spaced apart from the gate 26 by an interlayer dielectric layer 21, and is spaced apart from the barrier layer 18 by the interlayer dielectric layer 21 and the surface dielectric layer 25. The field plate 28 extends above the gate 26 and laterally toward the drain 24.

The field plate 28 is connected to the source contact 22. Connecting the field plate 28 to the source contact 22 provides a reduction in gate-to-drain capacitance (Cgd), which consequently can enhance the gain of the device. In addition to reducing gate-to-drain capacitance Cgd, the presence of the field plate 28 may improve linearity of the device and/or reduce the drain bias dependence of the capacitance. While GaN-based HEMTs generally display good linearity, further improvement may be desired for in high power RF applications. Moreover, while the structure shown in FIG. 1 can have a reduced gate-to-drain capacitance Cgd compared to structures without a field plate, the gate-to-drain capacitance Cgd can still show a large dependence on the bias of the drain contact 24.

In operation, the 2DEG 20 formed at the interface between the channel layer 16 and the barrier layer 18 provides a conductive channel that allows charge carriers to flow between the source contact 22 and the drain contact 24 in the +/−X-direction shown in FIG. 1. The conductivity of the channel is modulated by applying a voltage to the gate 26. The dimension between the source contact 22 and the drain contact 24 in the X-direction is referred to as the channel length. The total current-carrying capacity, and thus the total power, of the device is determined by the channel width, which is the span of the active region of the device in a direction into the X-Z plane illustrated in FIG. 1 (e.g., the Y-direction).

SUMMARY

A transistor device according to some embodiments includes a first unit subcell including a first active region having a first active region width extending in a first direction, a first source contact in the first active region and extending in the first direction, a drain contact in the first active region and extending in the first direction, and a first gate contact between the first source contact and the drain contact, wherein the first gate contact extends in the first direction and is configured to modulate a conductivity of the first channel region in response to a gate voltage. The first source contact and the drain contact define a first channel region in the first active region between the first source contact and the drain contact. The first channel region is configured to permit current flow between the first source contact and the drain contact in a second direction, perpendicular to the first direction. The drain contact extends outside the active region.

The transistor device includes a second unit subcell arranged adjacent the first unit subcell in the first direction. The second unit subcell includes a second active region having a second active region width extending in the first direction, wherein the drain contact extends into the second active region, a second source contact in the second active region and extending in the first direction, and a second gate contact between the second source contact and the drain contact, wherein the second gate contact extends in the first direction and is configured to modulate a conductivity of the second channel region in response to the gate voltage.

The second source contact and the drain contact define a second channel region in the second active region between the second source contact and the drain contact. The second channel region is configured to permit current flow between the second source contact and the drain contact in the second direction.

The first unit subcell and the second unit subcell may be aligned in the first direction.

The transistor device may further include a first field plate in the first channel region, wherein the first field plate is connected to the first source contact outside the first active region without crossing over the first gate contact, and a second field plate in the second channel region, wherein the second field plate is connected to the second source contact outside the second active region without crossing over the second gate contact.

The transistor device may further include a plurality of pairs of first and second unit subcells, wherein the plurality of pairs of first and second unit subcells are spaced apart in the second direction. In some embodiments, each of the unit subcells of the transistor device has a gate finger width of less than 200 microns, and the transistor device is capable of achieving a linear power density relative to the second direction of greater than 40 W/mm an operating frequency of 10 GHz.

In some embodiments, the transistor device is capable of achieving a linear power density relative to the second direction of greater than 45 W/mm.

In some embodiments, the transistor device is capable of achieving a linear power density relative to the second direction of greater than 50 W/mm.

In some embodiments, the transistor device is capable of achieving a gain of greater than 10 dB at an operating frequency of 10 GHz while achieving a linear power density relative to the second direction of greater than 40 W/mm.

In some embodiments, the transistor device is capable of achieving a gain of greater than 13 dB at an operating frequency of 10 GHz while achieving a linear power density relative to the second direction of greater than 40 W/mm.

The transistor device may be a gallium nitride based high electron mobility transistor device.

In some embodiments, the first and/or second unit subcell includes a semiconductor epitaxial layer structure including a channel layer and a barrier layer on the channel layer, a first insulating layer on the semiconductor layer between the source contact and the drain contact, and a gate contact on the first insulating layer. The source contact and the drain contact are on the barrier layer. The gate contact includes a central portion that extends through the first insulating layer and contacts the barrier layer and a drain side wing that extends laterally from the central portion of the gate toward the drain contact by a distance $\Gamma_D$. The drain side wing of the gate contact is spaced apart from the barrier layer by a distance d1 that is equal to a thickness of the first insulating layer. The distance $\Gamma_D$ is less than about 0.3 μm, and the distance d1 is less than about 80 nm.

The distance $\Gamma_D$ may be between about 0.1 μm and 0.3 μm, and the distance d1 may be between about 60 nm and 80 nm. The distance $\Gamma_D$ may be about 0.2 am and the distance d1 may be about 70 nm.

The barrier layer may include AlGaN with an aluminum concentration greater than 20% and a thickness of less than 25 nm.

A distance $L_{GS}$ between the central portion of the gate contact and the source contact may be between about 0.8 μm and 1.2 μm. A distance $L_{GD}$ between the central portion of the gate contact and the drain contact may be between about 3.2 μm and 3.8 μm.

The semiconductor epitaxial layer structure may be formed on a substrate, which may include silicon carbide and have a thickness of less than about 100 μm.

The gate contact may include a source side wing that extends laterally from the central portion of the gate toward the drain contact by a distance $\Gamma_S$ where $\Gamma_S$ may be less than about 0.3 μm. In some embodiments, $\Gamma_S$ may be less than $\Gamma_D$.

The first and/or second unit subcell may further include a field plate above the semiconductor epitaxial layer structure between the gate contact and the drain contact. The field plate may include a central portion that may be spaced apart from the barrier layer by a distance d2, where d2 may be less than 250 nm. In some embodiments, d2 may be between 190 nm and 230 nm.

The field plate may be laterally spaced apart from the gate contact by a distance TT-FP2, where TT-FP2 may be between about 0.3 am and 0.5 μm.

The field plate may include a central field plate portion a source side field plate wing extending away from the central field plate portion toward the source contact and a drain side field plate wing extending away from the central field plate portion toward the source contact. The source side field plate wing and the drain side field plate wing may be spaced apart from the barrier layer by a distance d3 that may be between about 250 nm and 310 nm.

The central portion of the gate contact may have a width of about 200 nm to 300 nm at an interface with the barrier layer.

A gallium nitride based transistor device according to some embodiments includes a plurality of pairs of unit subcells, the unit subcells of each pair of unit subcells having gate fingers aligned in a first direction, wherein the plurality of pairs of unit subcells are spaced apart in a second direction that is perpendicular to the first direction. Each of the unit subcells of the transistor device has a gate finger width less than 200 microns, and the transistor device is capable of achieving a linear power density relative to the second direction of greater than 40 W/mm an operating frequency of 10 GHz.

In some embodiments, the transistor device is capable of achieving a linear power density relative to the second direction of greater than 45 W/mm, and in some embodiments greater than 50 W/mm.

In some embodiments, the transistor device is capable of achieving a gain of greater than 10 dB at an operating frequency of 10 GHz while achieving a linear power density relative to the second direction of greater than 40 W/mm.

In some embodiments, the transistor device is capable of achieving a gain of greater than 13 dB at an operating frequency of 10 GHz while achieving a linear power density relative to the second direction of greater than 40 W/mm.

DETAILED DESCRIPTION OF EMBODIMENTS

Figure 1:
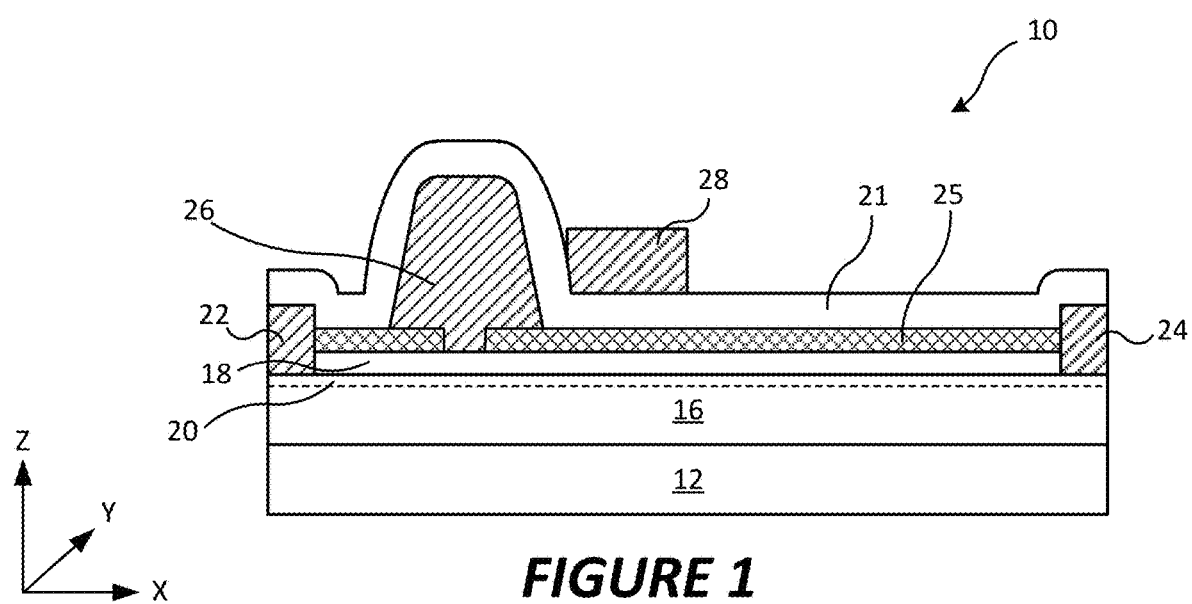
FIG. 1 is a cross-sectional view of a conventional transistor device including a field plate.

Embodiments of the inventive concepts will now be described in connection with the accompanying drawings. Some embodiments described herein provide a transistor device including a field plate that is self-aligned the gate, and in some embodiments that is laterally spaced apart from the gate, such that the field plate does not overlap the gate in the vertical direction. In some embodiments, the field plate is recessed toward the barrier layer in a recess region. In still further embodiments, the field plate may be connected to the source outside an active area of the device by means of a connection that does not cross over the gate of the device.

It is also understood that, although the ordinal terms first, second, third, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Furthermore, relative terms, such as "lower" or "bottom" and "upper" or "top," may be used herein to describe the relationship of one element to another as illustrated in the drawings. It is understood that relative terms are intended to encompass different orientations of the device in addition to the orientation depicted in the drawings. For example, if the device in one of the drawings is turned over, features described as being on the "lower" side of an element would then be oriented on "upper" side of that element. The exemplary term "lower" can therefore describe both lower and upper orientations, depending of the particular orientation of the device. Similarly, if the device in one of the drawings is turned over, elements described as "below" or "beneath" other elements would then be oriented above those other elements. The exemplary terms "below" or "beneath" can therefore describe both an orientation of above and below.

The terminology used in the description of the disclosure herein is for the purpose of describing particular embodiments only and is not intended to be limiting of the disclosure. As used in the description of the disclosure and the appended claims, the singular forms "an" and "the" are intended to include the plural forms as well, unless the context clearly indicates otherwise. It is also understood that the term "and/or" as used herein refers to and encompasses any and all possible combinations of one or more of the associated listed items. It will be further understood that the terms "comprises" and "comprising," when used in this specification, specify the presence of stated steps, operations, features, elements, and/or components, but do not preclude the presence or addition of one or more other steps, operations, features, elements, components, and/or groups thereof.

Embodiments of the disclosure are described herein with reference to cross-section illustrations that are schematic illustrations of idealized embodiments of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. The regions illustrated in the drawings are schematic in nature, and their shapes are not intended to illustrate the actual shape of a region of a device and are not intended to limit the scope of the disclosure unless explicitly stated otherwise. Further, lines that appear straight, horizontal, or vertical in the below drawings for schematic reasons will often be sloped, curved, non-horizontal, or non-vertical. Further, while the thicknesses of elements are meant to be schematic in nature.

Unless otherwise defined, all terms used in disclosing embodiments of the disclosure, including technical and scientific terms, have the same meaning as commonly understood by one of ordinary skill in the pertinent art and are not necessarily limited to the specific definitions known at the time of the present disclosure. Accordingly, these terms can include equivalent terms that are created after such time. It is further understood that terms, such as those defined in commonly used dictionaries, should be interpreted as having a meaning that is consistent with their meaning in the present specification and in the context of the relevant art.

Figure 2A:
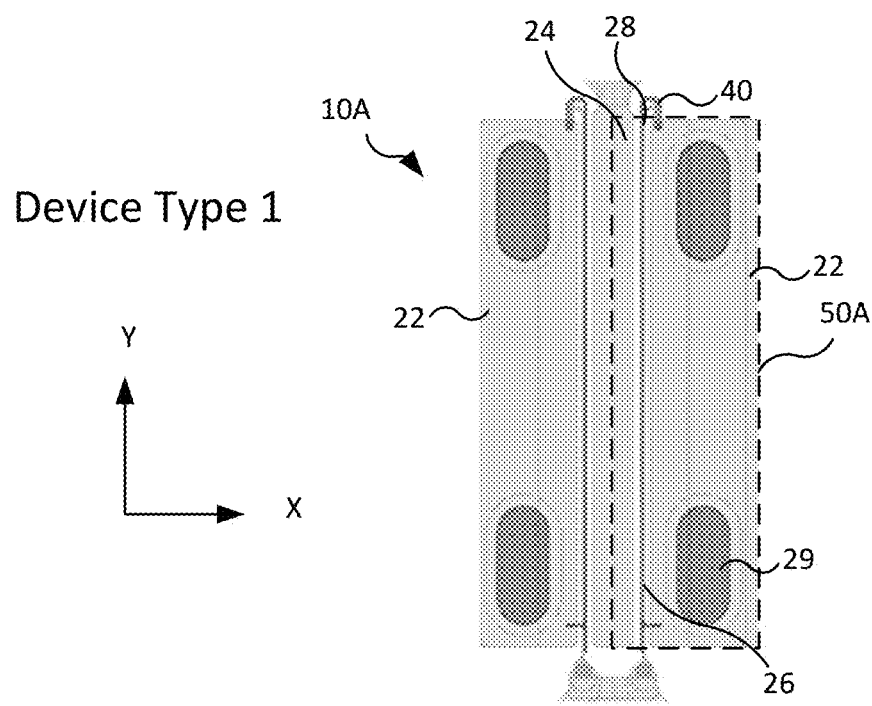
FIGS. 2A and 2B illustrate unit cells of devices that have a conventional unit cell structure.

FIG. 2A is a plan view illustration of a layout of a HEMT device structure 10A having a first device type (Device Type 1). The device structure 10A is a so-called "long finger" device that includes a unit cell 50A that shares a drain contact 24 with an adjacent unit cell. The unit cell 50A includes the drain contact 24, a source contact 22, a gate contact 26 and a field plate 28 that is connected to the source contact 22 via a connection structure 40 that is outside an active region of the unit cell 50A and that does not cross over the gate contact 26. As noted above, the distance between the source contact 22 and the drain contact 24 in the X-direction is referred to as the gate length. The gate width of the unit cell 50A is defined by the span of the source contact 22 in the Y-direction, and defines a width of the active region of the cell 50A in which current flows between the source contact 22 and the drain contact 24.

As noted above, the total current-carrying capacity, and thus the total power, of the device is determined by the channel width, which is the span of the active region of the device in the Y-direction. To increase the power output by a unit cell, a simplistic approach is to increase the size of the unit cell 50A in the direction of the channel width (i.e., the Y-direction in FIG. 2A). However, this approach has some drawbacks, as increasing the channel width too much can impair the frequency response of the device, resulting in decreased gain at high frequency operation.

Figure 2B:
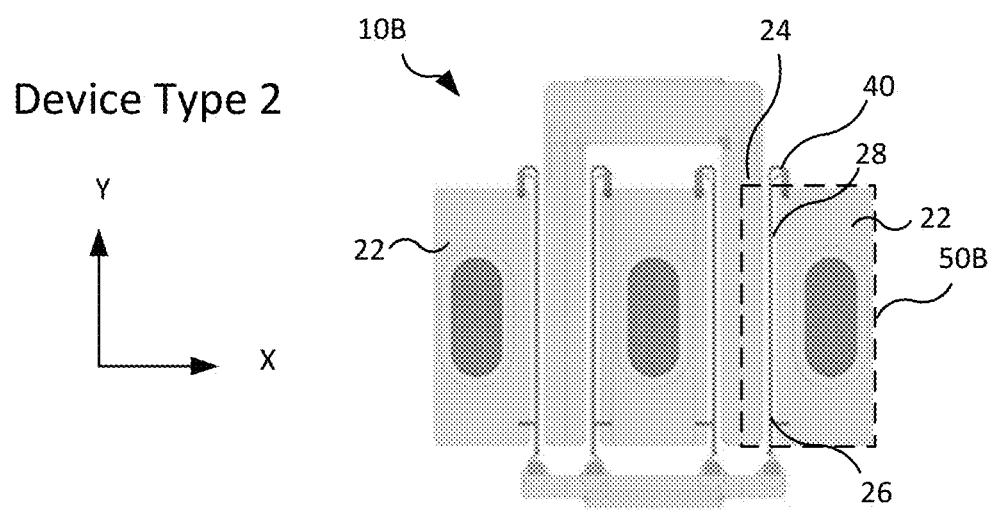

A possible solution to this problem is illustrated in FIG. 2B, which illustrates a plan view layout of a device having a second device type (Device Type 2) with a so-called "short finger" device structure 10B having four unit cells 50B with shorter gate widths. Having shorter gate widths means that the unit cells 50B are less susceptible to decreased gain at high frequency. For comparison, the two-cell device structure 10A shown in FIG. 2A may have an active region with a span in the Y-direction of 0.36 mm for a total channel width of 2×0.36=0.72 mm. The four cell structure 10C may have a span in the an active region with a span in the Y-direction of 0.18 mm for a total channel width of 4×0.18=0.72 mm. However, because four unit cells are required in the device 10B to achieve the same total channel width as the device 10A, the linear power density of the device relative to total device length (i.e., the total span of the device in the X-direction of channel length) is halved compared to the two-cell device structure 10A of FIG. 2A.

Figure 2C:
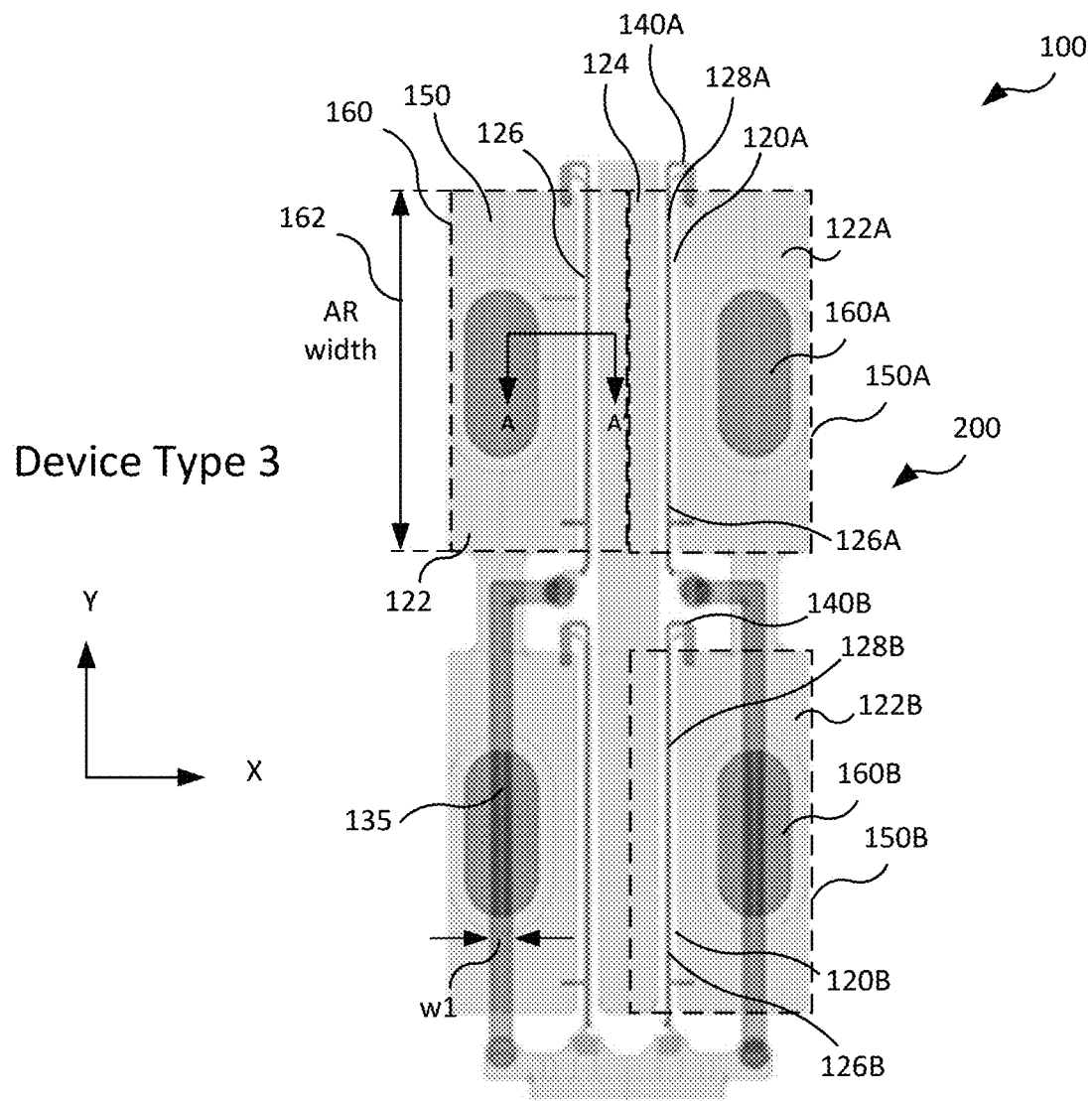
FIG. 2C illustrates a unit cell of a device having a stacked unit subcell structure according to some embodiments.

FIG. 2C illustrates a plan view layout of a transistor device 100 according to some embodiments having a third device type (Device Type 3) that combines aspects of Device Type 1 and Device Type 2 to provide a device having both high power density and high frequency operation. In particular, the device 100 has a stacked unit subcell arrangement described in detail below.

Referring to FIG. 2C, a transistor device structure 100 according to some embodiments includes a unit cell 200 including a pair of unit subcells 150A, 150B aligned in a first direction (i.e., the Y-direction) that is parallel to the orientation of the gate fingers 126A, 126B and perpendicular a second direction (i.e., the X-direction) that corresponds to the direction of current flow in the device. The unit subcells 150A, 150B together form a unit cell 200 of a larger device structure.

In particular, the device structure 100 includes a first unit subcell 150A having a first active region 160A. The first active region 160A has an active region width 162 that extends in a first direction (i.e., the Y-direction).

For clarity, an active region 160 of a unit subcell 150 that is adjacent to the first unit subcell 150B in the X-direction is illustrated. The active region 160 includes portions of a source contact 122, a gate contact 126, and a drain contact 124, and has an active region width 162 that corresponds to a width of the source contact 122.

The first unit subcell 150A includes a first source contact 122A that extends in the first direction and a drain contact 124 that extends in the first direction. The first source contact 122A and the drain contact 124 define a first channel region 120A in the first active region 160A between the first source contact 122A and the drain contact 124. The first channel region 120A is configured to permit current flow between the first source contact 122A and the drain contact 124 in a second direction (i.e., the X-direction in FIG. 2C), that is perpendicular to the first direction.

As shown in FIG. 2C, the drain contact 124 extends outside the first active region 160A in the first direction. As discussed below, the drain contact 124 is shared between the first unit subcell 150A and a second unit subcell 150B that is aligned with the first unit subcell 150A in the first direction.

The first unit subcell 150A further includes a first gate contact 126A, also called a "gate finger," between the first source contact 122A and the drain contact 124. The first gate contact 126A extends in the first direction and is configured to modulate a conductivity of the first channel region 120A in response to a gate voltage applied to the first gate contact 126A.

The transistor device structure 100 further includes a first field plate 128A in the first active region 160A. The first field plate 128A is provided between the first gate contact 126A and the drain contact 124 and is connected to the first source contact 122A by a first connection structure 140A outside the first active region 160A without crossing over the first gate contact 126A.

The device structure 100 further includes a second unit subcell 150B arranged adjacent the first unit subcell 150A and aligned with the first unit subcell 150A in the first direction. The second unit subcell 150A includes a second active region 160A having a second active region width 162 extending in the first direction. The drain contact 124 extends into the second active region 160B of the second unit subcell 150B.

The second unit subcell 150B includes a second source contact 122B in the second active region 160B and extending in the first direction. The second source contact 122B and the drain contact 124 define a second channel region 120B in the second active region 160B between the second source contact 122B and the drain contact 124. The second channel region 120B is configured to permit current flow between the second source contact 122B and the drain contact 124 in the second direction (i.e., the X-direction).

The second unit subcell 150B further includes a second gate contact 126B between the second source contact 122B and the drain contact 124. The second gate contact 126B extends in the first direction (i.e., the Y-direction) and is configured to modulate a conductivity of the second channel region 120B in response to the gate voltage.

As shown in FIG. 2C, the first unit subcell 150A and the second unit subcell 150B are aligned in the first direction and share a common drain contact 124. The first gate contact 126A is parallel to the second gate contact 126B and aligned with the second gate contact 126B in the first direction, and the first source contact 122A is parallel to the second source contact 122B and aligned with the second source contact 126B in the first direction.

The transistor device structure 100 further includes a second field plate 128B in the second active region 160B. The second field plate 128B is provided between the second gate contact 126B and the drain contact 124 and is connected to the second source contact 122B by a second connection structure 140B outside the second active region 160B without crossing over the second gate contact 126B.

In some embodiments, each of the unit subcells 150A, 150B of the transistor device 100 has a gate finger width of less than about 200 microns. The total gate finger width of a unit cell 200 including stacked unit subcells 150A, 150B is twice the gate finger width of a single subcell 150A, 150B. For example, each unit subcell 150A, 150B may have a gate finger width of about 180 microns, and the entire unit cell 200 may have a total gate finger width of about 360 microns. As discussed in more detail below, in some embodiments, a gallium nitride high electron mobility transistor device having the transistor device structure 100 may be capable of achieving a linear power density relative to the second direction of greater than 40 W/mm an operating frequency of 10 GHz.

Figure 3A:
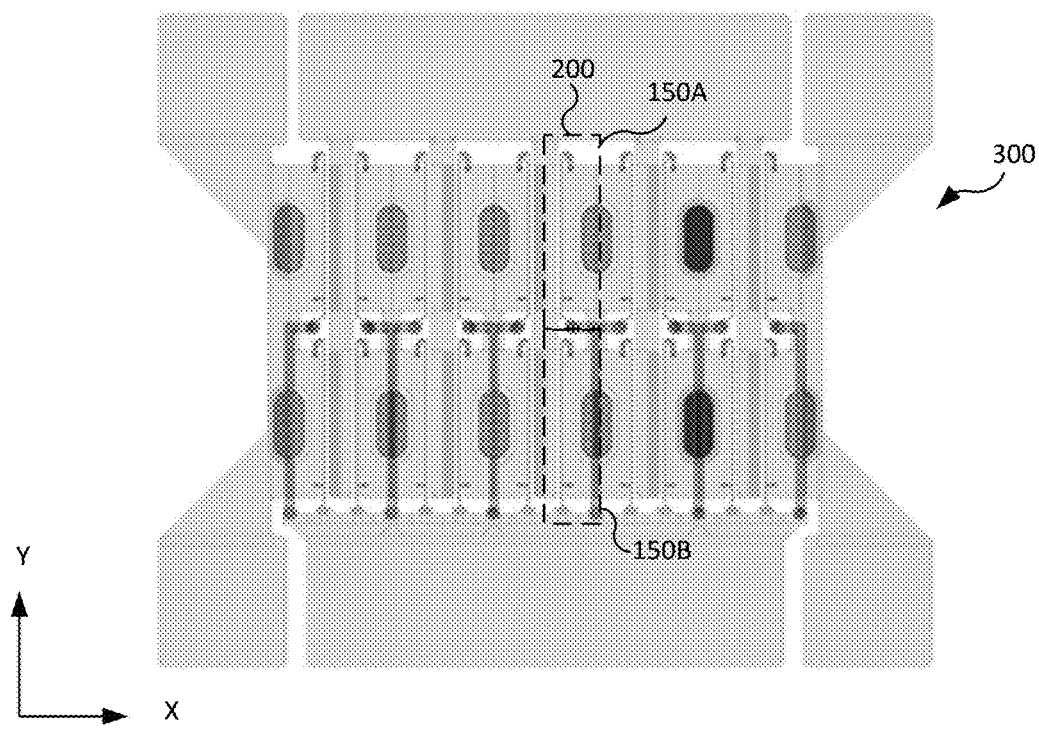
FIG. 3A illustrates a layout of a device having a stacked unit subcell structure according to some embodiments.

FIG. 3A illustrates a layout for a monolithic microwave integrated circuit (MMIC) 300 having a stacked unit subcell structure according to some embodiments. The MMIC 300 includes a plurality of pairs of unit subcells 150A, 150B, where each pair of unit subcells 150A, 150B makes up a unit cell 200 of the device. The device 300 includes a plurality of unit cells 200 arranged in the second direction (i.e., the X-direction). The unit subcells 150A, 150B of each pair of unit subcells has gate fingers 126A, 126B aligned in the first direction (i.e., the Y-direction). The plurality of pairs of unit subcells 150A, 150B are spaced apart in the second direction (i.e., the X-direction).

Figure 3B:
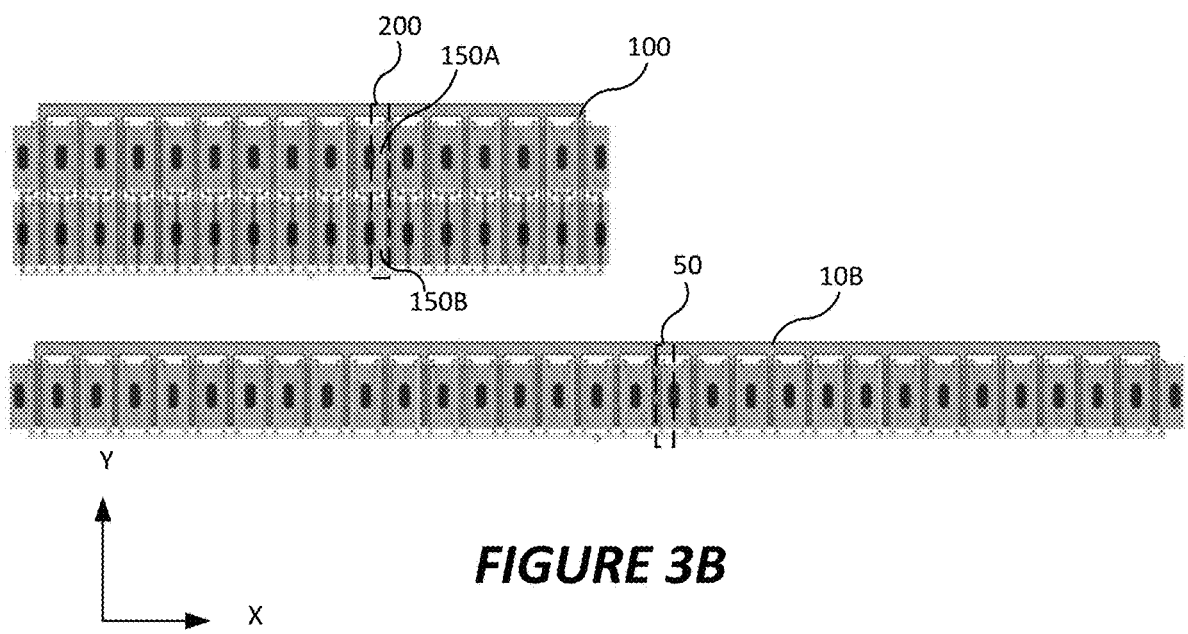
FIG. 3B illustrates a layout of a device having a stacked unit subcell structure according to some embodiments compared with a device that have a conventional unit cell structure.

FIG. 3B is a comparison of a device structure 100 that has a stacked unit subcell arrangement according to some embodiments and a device structure 10B (FIG. 2B) that has a short-finger unit cell arrangement. The gate width of a unit subcell 150A, 150B of the device structure 100 is the same as the gate width of a unit cell 50B of the device structure 10B. Thus, although the device structure 100 only occupies half the chip width of the device structure 10B in the second direction (the X-direction), the device structures 100, 10B have the same total gate width. Because the devices 100, 10B have the same total gate width, they are expected to have similar power capabilities. However, the power density of the device structure 100 relative to the second direction (the X-direction) is expected to higher than the power density of the structure 10B, since the device structure 100 is only half as wide in the second direction as the device structure 10B.

Figure 4:
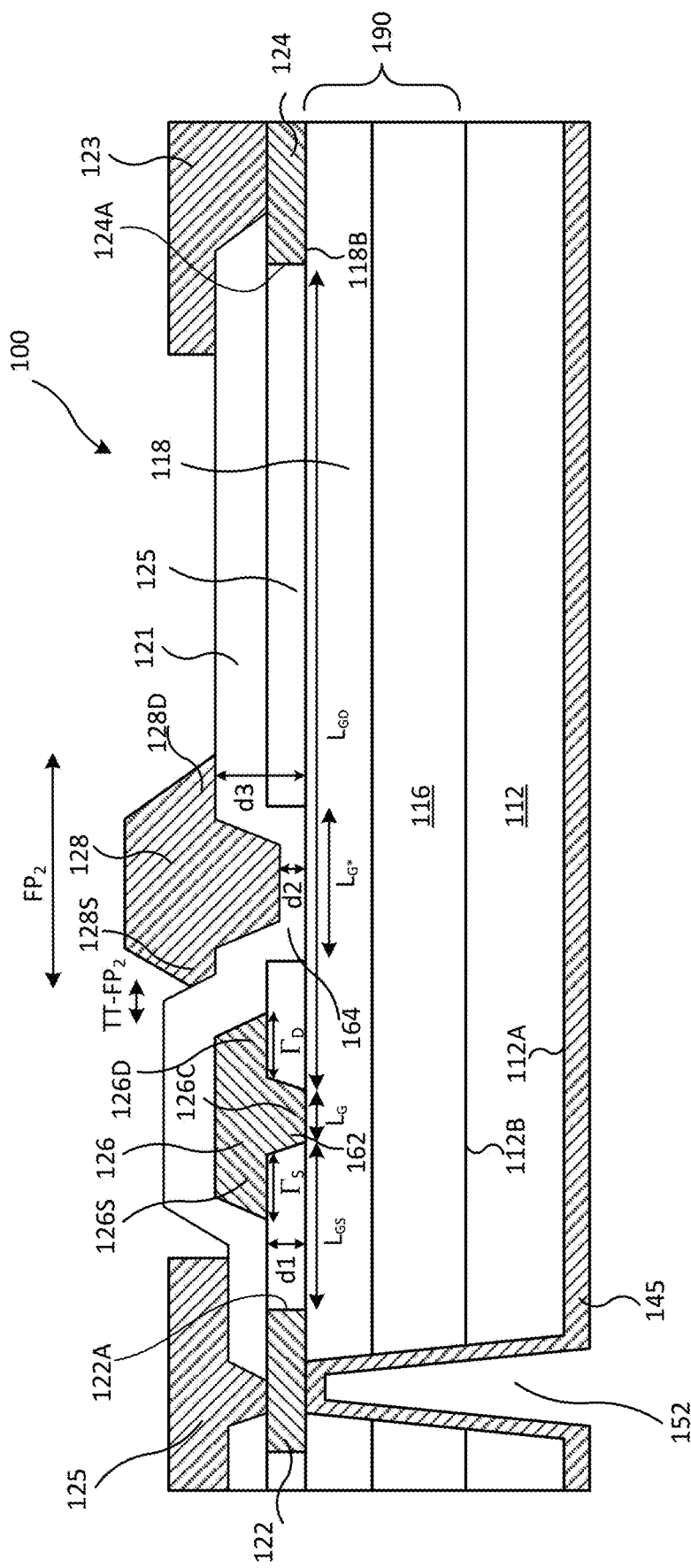
FIG. 4 is a cross-section of a unit subcell structure according to some embodiments.

FIG. 4 is a schematic cross-sectional view of the HEMT device 100 taken along line A-A' of FIG. 2C. It will be appreciated that FIGS. 2C and 4 are intended to schematically represent various aspects of the device 100 for purposes of illustration and description and are not intended to represent the structures to physical scale.

As shown in FIGS. 2C and 4, a HEMT device 100, may be formed on a substrate 112 such as a silicon carbide SiC substrate or a sapphire substrate. The substrate 112 may be, a semi-insulating silicon carbide (SiC) substrate that may be, for example, the 4H polytype of silicon carbide. Other silicon carbide candidate polytypes may include the 3C, 6H, and 15R polytypes. In some embodiments, the substrate may be a High Purity Semi-Insulating (HPSI) substrate, available from Cree, Inc.

In some embodiments, the silicon carbide bulk crystal of the substrate 112 may have a resistivity of about $10^5$ ohm-cm or higher at room temperature. Although silicon carbide may be used as a substrate material, embodiments of the present application may utilize any suitable substrate, such as sapphire ($Al_2O_3$), aluminum nitride (AlN), aluminum gallium nitride (AlGaN), gallium nitride (GaN), silicon (Si), GaAs, LGO, zinc oxide (ZnO), LAO, indium phosphide (InP), and the like. The substrate 112 may be a silicon carbide wafer, and the HEMT device 100 may be formed, at least in part, via wafer-level processing, and the wafer may then be diced to provide a plurality of individual high electron mobility transistors 100.

The substrate 112 may have a lower surface 112A and an upper surface 112B. In some embodiments, the substrate 112 of the HEMT device 100 may be a thinned substrate 112 to facilitate formation of a via 152 therethrough as described below. In some embodiments, the thickness of the substrate 112 (e.g., in a vertical direction that is normal to the lower and upper surfaces 112A, 112B) may be 100 μm or less. In some embodiments, the thickness of the substrate 112 may be 75 μm or less. In some embodiments, the thickness of the substrate 112 may be 50 μm or less. In some embodiments, the thickness of the substrate 112 may be between 75 μm and 100 am (e.g., 3-4 mil).

A Group III-nitride based epitaxial layer structure 190 is formed on the substrate 112. As used herein, the term "Group III-nitride" refers to those semiconducting compounds formed between nitrogen (N) and the elements in Group III of the periodic table, usually aluminum (Al), gallium (Ga), and/or indium (In). The term also refers to ternary and quaternary (or higher) compounds such as, for example, AlGaN and AlInGaN. As is well understood by those in this art, the Group III elements can combine with nitrogen to farm binary (e.g., GaN), ternary (e.g., AlGaN, AlInN), and quaternary (e.g., AlInGaN) compounds. These compounds all have empirical formulas in which one mole of nitrogen is combined with a total of one mole of the Group III elements.

In particular, the epitaxial layer structure 190 includes a channel layer 116 formed on the upper surface 112B of the substrate 112 (or on the optional layers described further herein), and a barrier layer 118 formed on an upper surface of the channel layer 116. The channel layer 116 and the barrier layer 118 may each be formed by epitaxial growth. The channel layer 116 may have a bandgap that is less than the bandgap of the barrier layer 118, and the channel layer 116 may also have a larger electron affinity than the barrier layer 118.

The channel layer 116 and the barrier layer 118 may include Group III-nitride based materials. In some embodiments, the channel layer 116 may be a Group III nitride, such as $Al_xGa1-xN$, where $0 \leq x < 1$, provided that the energy of the conduction band edge of the channel layer 116 is less than the energy of the conduction band edge of the barrier layer 118 at the interface between the channel layer 116 and the barrier layer 118. In certain embodiments, x=0, indicating that the channel layer 116 is GaN. The channel layer 116 may also be formed from other Group III-nitrides such as InGaN, AlInGaN or the like. The channel layer 116 may be undoped ("unintentionally doped") and may be grown to a thickness of greater than about 0.002 μm. In some embodiments, the channel layer may be selectively doped with, for example, silicon or other dopants. The channel layer 116 may also be a multi-layer structure, such as a superlattice or combinations of GaN, AlGaN or the like. The channel layer 116 may be under compressive strain in some embodiments.

In some embodiments, the barrier layer 118 is AlN, AlInN, AlGaN or AlInGaN or combinations of layers thereof. The barrier layer 118 may comprise a single layer or may be a multi-layer structure. In particular embodiments, the barrier layer 118 may be thick enough and may have a high enough aluminum (Al) composition and doping to induce a 2DEG at the interface between the channel layer 116 and the barrier layer 118. The barrier layer 118 may, for example, be from about 0.1 nm to about 30 nm thick, but not so thick as to cause cracking or substantial defect formation therein. In particular embodiments, the barrier layer 118 may have a thickness less than about 25 nm, and in particular may have a thickness of about 18 nm.

In certain embodiments, the barrier layer 118 is undoped or doped with an n-type dopant to a concentration less than about $10^{19}$ $cm^{-3}$. In some embodiments, the barrier layer 118 is $Al_xGa1-xN$ where $0 < x < 1$. In particular embodiments, the aluminum concentration is about 25%. However, in other embodiments, the barrier layer 118 comprises AlGaN with an aluminum concentration of between about 5% and less than about 100%. In specific embodiments, the aluminum concentration is greater than about 20%. In some embodiments, the aluminum concentration may be about 20% to about 30%, and in some embodiments about 25%.

The channel layer 116 and/or the barrier layer 118 may be formed, for example, by metal-organic chemical vapor deposition (MOCVD), molecular beam epitaxy (MBE), or hydride vapor phase epitaxy (HVPE). As discussed above, a 2DEG layer is induced in the channel layer 116 at a junction between the channel layer 116 and the barrier layer 118. The 2DEG layer acts as a highly conductive layer that allows conduction between the source and drain regions of the device that are beneath the source contact 122 the drain contact 124, respectively.

While the device 100 is shown with a channel layer 116 and barrier layer 118 for purposes of illustration, The epitaxial layer structure 190 of the device 100 may include additional layers/structures/elements such as a buffer and/or nucleation layer(s) between channel layer 116 and substrate 112, and/or a cap layer on barrier layer 118. For example, an AlN buffer layer may be formed on the upper surface 112B of the substrate 112 to provide a crystal structure transition between the silicon carbide substrate 112 and the remainder of the HEMT device 100. Additionally, strain balancing transition layer(s) may also and/or alternatively be provided as described, for example, in U.S. Pat. No. 7,030,428, the disclosure of which is incorporated herein by reference as if set forth fully herein. The optional buffer/nucleation/transition layers may be deposited by MOCVD, MBE, and/or HVPE.

A source contact 122 and a drain contact 124 are formed on an upper surface 118B of the barrier layer 118 and are laterally spaced apart from each other. A gate contact 126 is formed on the upper surface 118B of the barrier layer 118 between the source contact 122 and the drain contact 124. The material of the gate contact 126 may be chosen based on the composition of the barrier layer 118, and may, in some embodiments, form a Schottky contact to the barrier layer 118. Conventional materials capable of making a Schottky contact to a gallium nitride based semiconductor material may be used, such as, for example, nickel (Ni), platinum (Pt), nickel silicide (NiSix), copper (Cu), palladium (Pd), chromium (Cr), tungsten (W) and/or tungsten silicon nitride (WSiN).

The source contact 122 and the drain contact 124 may include a metal that can form an ohmic contact to a gallium nitride based semiconductor material. Suitable metals may include refractory metals, such as Ti, W, titanium tungsten (TiW), silicon (Si), titanium tungsten nitride (TiWN), tungsten silicide (WSi), rhenium (Re), Niobium (Nb), Ni, gold (Au), aluminum (Al), tantalum (Ta), molybdenum (Mo), NiSix, titanium silicide (TiSi), titanium nitride (TiN), WSiN, Pt and the like. In some embodiments, the source contact 122 may be an ohmic source contact 122.

The source contact 122 may be coupled to a reference signal such as, for example, a ground voltage. The coupling to the reference signal may be provided by a via 152 that extends from a lower surface 112A of the substrate 112, through the substrate 112 to an upper surface of the barrier layer. The via 152 may expose a bottom surface of the source contact 122. A backmetal layer 145 is formed on the lower surface 112A of the substrate 112 and on side walls of the via 152. The backmetal layer 145 may directly contact the source contact 122. In some embodiments a contact area between the backmetal layer 145 and the bottom surface of the source contact 122 may be fifty percent or more of an area of the bottom surface of the source contact 122. Thus, the backmetal layer 145, and a signal coupled thereto, may be electrically connected to the source contact 122.

The dimensions of the device 100 may be decreased by directly connecting the via 152 to the source contact 122 without the requirement of an interconnecting metallization layer. As noted above, the substrate 112 may be thinned to allow for a reduction in the horizontal cross-sectional area of the via 152, further reducing the area of the device 100. In addition to the density improvements that may result from reducing the area of the device 100, an overall parasitic capacitance of the device 100 may also be decreased, which may lead to additional improvements in switching frequency of the resulting circuit.

The formation of the via 152 is described, for example, in U.S. Patent Publication No. 2020/0395475, the disclosure of which is incorporated herein by reference in its entirety.

In some embodiments, the via 152 may have an oval or circular cross-section when viewed in a plan view as shown in FIG. 2C. However, the present inventive concepts are not limited thereto. In some embodiments, dimensions of the via (e.g., a length and/or a width) may be such that a largest cross-sectional area of the via 152 is 1000 µm2 or less. The cross-sectional area may be taken in a direction that is parallel to the lower surface 112A of the substrate 112.

In some embodiments, the source contact 122, the drain contact 124, and the gate contact 126 may be formed as a plurality of source contacts 122, drain contacts 124, and gate contacts 126 on the substrate 112. Referring to FIG. 2C, a plurality of drain contacts 124 and source contacts 122 may be alternately arranged on the substrate 112. A gate contact 126 may be disposed between adjacent drain contacts 124 and source contacts 122 to define a plurality of transistor unit cells. As shown in FIG. 2C, an ohmic source contact of a first one of the transistor unit cells may be shared with of a second one of the transistor unit cells.

A HEMT transistor unit cell may be defined by the active region between the source contact 122 and the drain contact 124 under the control of a gate contact 126 between the source contact 122 and the drain contact 124. The HEMT device 100 may include adjacent HEMT unit transistors sharing a source contact 122. By sharing the source contact 122 between adjacent HEMT transistors and reducing a size of the via 152, the distance between adjacent source contacts 122 with at least one drain contact 124 therebetween may be reduced.

Referring again to FIG. 4, the HEMT device 100 according to some embodiments includes a first insulating layer 125 and a second insulating layer 121. The first insulating layer 125, which may comprise SiN, directly contacts the upper surface of the epitaxial layer structure 190 of the device 100 (e.g., contacts the upper surface of the barrier layer 118) and has a thickness d1. The thickness d1 may be between 60 nm and 80 nm. In particular, the thickness d1 may be about 70 nm.

The second insulating layer 121, which may comprise SiOx, SiN or SiON, is formed on the first insulating layer 125 and has a thickness d2. The thickness d2 may be between 190 nm and 230 nm. In particular, the thickness d2 may be about 210 nm.

It will also be appreciated that more than two insulating layers may be included in some embodiments. The first insulating layer 125 and the second insulating layer 121 may serve as passivation layers for the HEMT device 100, and may also act as insulating interlayers for separating metallization layers of the device 100. The present inventors have found that thicknesses first and second insulating layers 125, 121 are important design parameters for obtaining HEMT devices with high RF performance and high reliability.

The source contact 122, the drain contact 124, and the gate contact 126 may be formed to extend through the first insulating layer 125. In some embodiments, at least a portion of the gate contact 126 may be on the first insulating layer 125. In some embodiments, the gate contact 126 may be formed as a T-shaped gate and/or a gamma gate including a central contact portion 126C, a source-side wing portion 126S and a drain-side wing portion 126D. The second insulating layer 121 is formed on the first insulating layer 125 and on portions of the drain contact 124, gate contact 126, and source contact 122.

In particular, the gate contact 126 may have a central contact portion 126C that extends through an opening 162 in the first insulating layer 125. The gate contact 126 has a source side wing portion 126S that extends across an upper surface of the first insulating layer 125 toward the source contact 126 by a distance $\Gamma_S$ and a drain-side wing portion 126D that extends across an upper surface of the first insulating layer 125 toward the drain contact 124 by a distance $\Gamma_D$ In some embodiments, $\Gamma_S$ and $\Gamma_D$ may each be between about 0.1 µm and 0.3 µm. In particular embodiments, $\Gamma_S$ and $\Gamma_D$ may each be between about 0.2 µm. In some embodiments, $\Gamma_S$ and $\Gamma_D$ are equal such that the gate 126 is symmetric about the central contact portion 126C. In some embodiments, the length $\Gamma_S$ of the source side wing 126S may be greater than the length $\Gamma_D$ of the drain side wing 126D. In some embodiments, the length $\Gamma_D$ of the drain side wing 126D may be greater than the length $\Gamma_S$ of the source side wing 126S. In some embodiments, either the source side wing 126S or the drain side wing 126S may be omitted entirely.

Both the source side wing 126S and the drain side wing 126D of the gate contact 126 are spaced apart from the barrier layer 118 by the distance d1, corresponding to the thickness of the first insulating layer 125. As noted above, the distance d1 may be between 60 nm and 80 nm. In particular embodiments, the distance d1 may be about 70 nm.

The width of the central contact portion 126C at the interface with the barrier layer 118 is indicated as $L_G$. In some embodiments, $L_G$ may be between about 200 nm and 300 nm, and in particular embodiments $L_G$ may be about 250 nm.

The contact portion 127 is spaced apart from the inner edge 122A of the source contact by a distance $L_{GS}$, and is spaced apart from the inner edge 124A of the drain contact by a distance $L_{GD}$. In some embodiments, $L_{GS}$ may be between about 0.8 am and 1.2 µm, and in particular embodiments $L_{GS}$ may be about 1 µm. In some embodiments, $L_{GD}$ may be between about 3.2 am and 3.8 µm, and in particular embodiments $L_{GD}$ may be about 3.5 µm.

One or more field plates 128 may be formed on the second insulating layer 121. The field plate 128 shown in FIG. 4 is spaced apart from the gate contact 126 toward the drain contact 124 by a distance TT-FP2. The distance TT-FP2 may be between about 0.3 am and 0.5 µm, and in particular embodiments may be about 0.4 µm.

The field plate 128 may have an overall width FP$_2$ of about 0.9 am to 0.95 µm, and in particular embodiments about 0.925 µm.

Table 1 shows a comparison of simulated performance of devices having the structure 10A of FIG. 2A (Device Type 1), the structure 10B of FIG. 2B (Device Type 2), and the structure 100 of FIG. 2C (Device Type 3).

TABLE 1

Comparison of Simulated Device Performance

| Device Type | X-dim | Y-dim | Area (mm²) | Finger width (mm) | Total periphery (mm) | Power @ 10 GHz (W) | Gain (dB) | Power/X-dim (W/mm) |
|---|---|---|---|---|---|---|---|---|
| 1 | 180 | 420 | 0.0756 | 360 | 0.72 | 9.02 | 10.6 | 50.1 |
| 2 | 300 | 290 | 0.087 | 180 | 0.72 | 9.24 | 14.0 | 30.8 |
| 3 | 180 | 440 | 0.0748 | 180 | 0.72 | 9.11 | 13.9 | 50.6 |

As seen in Table 1, all three simulated devices have the same total gate periphery (0.72 mm). Simulation results indicate that the device structure 10A (Device Type 1) is capable of a linear power density relative to the X-dimension of over 50 W/mm at 10 GHZ. However, the gain of the device 10A is relatively low (and drops off sharply at frequencies above 10 GHz). The performance and gain of the device structure 10A are degraded because of the device's long gate finger length.

The device structure 10B (Device Type 2) has higher gain, but is capable of producing only about 30 W/mm of linear power density relative to the X-dimension. The device structure 100 with a stacked unit subcell structure (Device type 3) is capable of achieving high gain at 10 GHz while maintaining high linear power density relative to the X-dimension of greater than 50 W/mm. Thus, the device structure 100 is capable of producing high gain while using less chip space than the device structure 10B.

Figure 5:
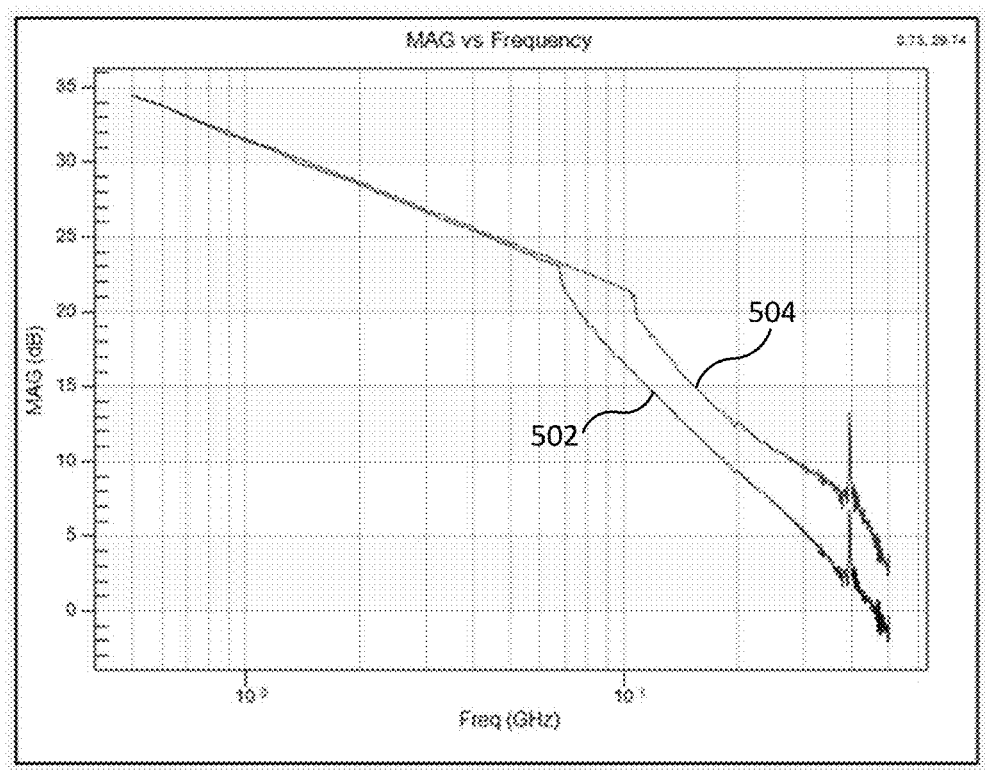
FIG. 5 is a graph illustrating simulated gain as a function of operating frequency for a device in accordance with some embodiments.

FIG. 5 is a graph of gain magnitude versus frequency for a device 10A having a conventional unit cell structure (curve 502) compared to a device 100 having a stacked unit subcell structure (curve 504) according to some embodiments. As seen in FIG. 5, performance of the devices is similar up until about 0.7 GHz, after which point the gain of the device structure 10A drops considerably compared to the gain of the device structure 100. By using the stacked unit subcell structure of FIG. 2C, it is possible to shrink the die and increase the total power per unit area while maintaining good performance at high frequency.

In some embodiments, each of the unit subcells 150A, 150B of the transistor device 100 has a gate finger width of less than 200 microns, and a transistor device having the device structure 100 is capable of achieving a linear power density relative to the second direction of greater than 40 W/mm an operating frequency of 10 GHz.

In some embodiments, a transistor device having the device structure 100 is capable of achieving a linear power density relative to the second direction of greater than 45 W/mm, and in some embodiments, a transistor device having the device structure 100 is capable of achieving a linear power density relative to the second direction of greater than 50 W/mm.

In some embodiments, a transistor device having the device structure 100 is capable of achieving a gain of greater than 10 dB at an operating frequency of 10 GHz while achieving a linear power density relative to the second direction of greater than 40 W/mm.

In some embodiments, a transistor device having the device structure 100 is capable of achieving a gain of greater than 13 dB at an operating frequency of 10 GHz while achieving a linear power density relative to the second direction of greater than 40 W/mm.

The device structure 100 shown in FIG. 2C is scalable to larger devices. In some embodiments, more than two sub-cells may be included in a single unit cell with a stacked unit subcell arrangement. Moreover, the stacked unit subcell arrangement described herein can be applied to discrete devices and to integrated circuit devices, such as MMICs.

Figure 6:
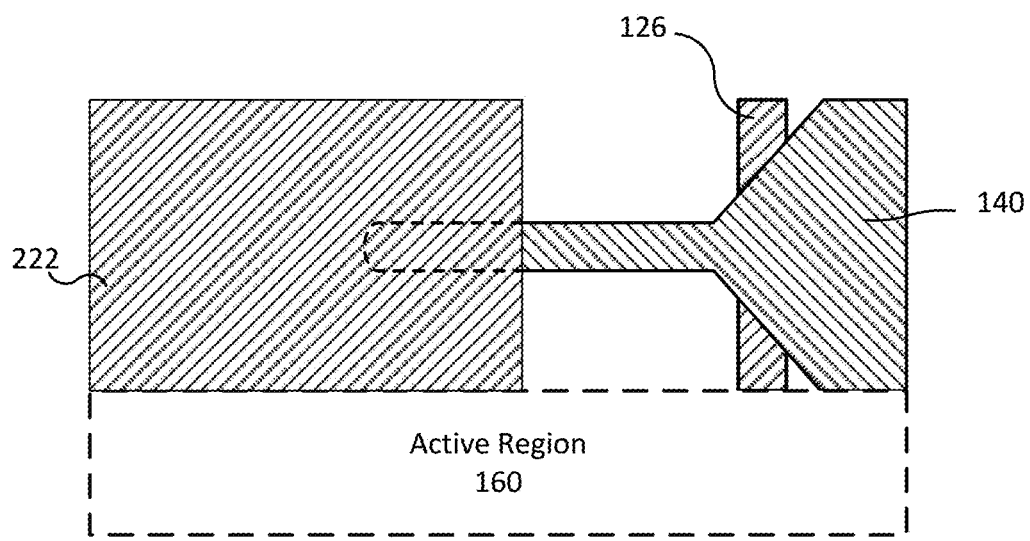
FIG. 6 is a plan view of a portion of a unit subcell of a conventional transistor structure outside the active area of the device.

To reduce the gate-to-drain capacitance Cgd and/or the drain-to-source capacitance Cds, the field plate 128 may be connected to the source contact 122 outside the active area of the device such that the connection does not cross over the gate metal. For example, FIG. 6 is a plan view of a portion of a conventional transistor structure outside the active region 160 of the device, where the "active region of the device" generally refers to the area of the device where an electrical channel between the source and drain regions is formed and where electrical conduction occurs through the channel layer 116 during ON-state operation of the device. As shown in FIG. 6, in a conventional device structure, the field plate 140 metallization crosses over the gate 126 metallization to contact a source overmetallization 222. This arrangement may increase the gate-to-drain capacitance Cgd and/or the drain-to-source capacitance Cds of the device.

Figure 7:
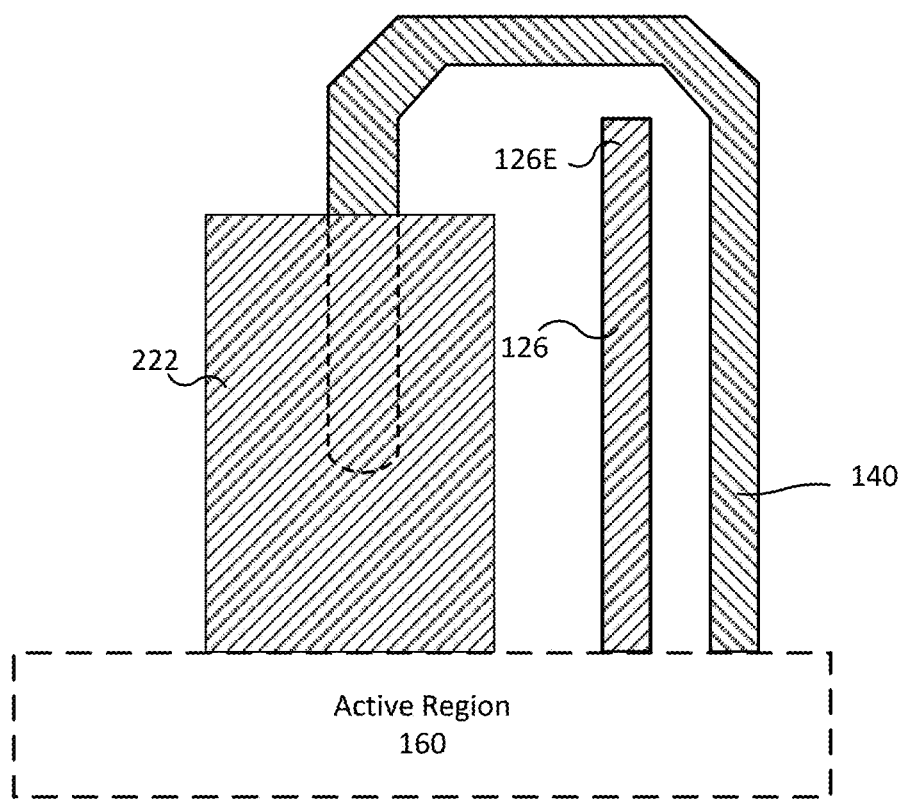
FIG. 7 is a plan view of a portion of a unit subcell of a transistor structure according to some embodiments outside the active area of the device.

FIG. 7 is a plan view of a portion of a transistor structure according to some embodiments outside the active region 160 of the device. As shown in FIG. 7, in some embodiments, the field plate 140 metallization extends around the distal end 126A of the gate 126 metallization (rather than crossing over the gate 126 metallization) to contact the source overmetallization 222. This arrangement may reduce the gate-to-drain capacitance Cgd and/or the drain-to-source capacitance Cds of the device.

Transistor devices as described herein may be used in amplifiers that operate in a wide variety of different frequency bands. In some embodiments, the RF transistor amplifiers incorporating transistor devices as described herein may be configured to operate at frequencies greater than 1 GHz. In other embodiments, the RF transistor amplifiers may be configured to operate at frequencies greater than 2.5 GHz. In still other embodiments, the RF transistor amplifiers may be configured to operate at frequencies greater than 3.1 GHz. In yet additional embodiments, the RF transistor amplifiers may be configured to operate at frequencies greater than 5 GHz. In some embodiments, the RF transistor amplifiers may be configured to operate in at least one of the 2.5-2.7 GHz, 3.4-4.2 GHz, 5.1-5.8 GHz, 12-18 GHz, 18-27 GHz, 27-40 GHz or 40-75 GHz frequency bands or sub-portions thereof.

Although embodiments of the inventive concepts have been discussed above with respect to HEMT devices, it will be understood that the inventive concepts described herein may be applied to other types of semiconductor devices, such as MOSFETs, DMOS transistors, and/or laterally diffused MOS (LDMOS) transistors.

RF transistor amplifiers incorporating transistor devices described herein can be used in standalone RF transistor amplifiers and/or in multiple RF transistor amplifiers. Examples of how the RF transistor amplifiers according to some embodiments may be used in applications that include multiple amplifiers will be discussed with reference to FIGS. 8A-8C.

Figure 8A:
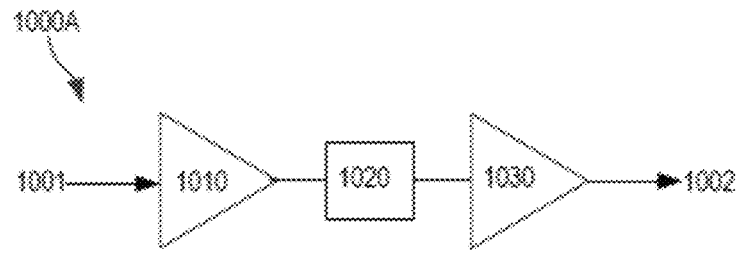
FIGS. 8A-8C are schematic block diagrams of multi-amplifier circuits in which RF transistor amplifiers incorporating transistor devices according to embodiments may be used.

Referring to FIG. 8A, an RF transistor amplifier 1000A is schematically illustrated that includes a pre-amplifier 1010 and a main amplifier 1030 that are electrically connected in series. As shown in FIG. 8A, RF transistor amplifier 1000A includes an RF input 1001, the pre-amplifier 1010, an inter-stage impedance matching network 1020, the main amplifier 1030, and an RF output 1002. The inter-stage impedance matching network 1020 may include, for example, inductors and/or capacitors arranged in any appropriate configuration in order to form a circuit that improves the impedance match between the output of pre-amplifier 1010 and the input of main amplifier 1030. While not shown in FIG. 8A, RF transistor amplifier 1000A may further include an input matching network that is interposed between RF input 1001 and pre-amplifier 1010, and/or an output matching network that is interposed between the main amplifier 1030 and the RF output 1002. The RF transistor amplifiers according to embodiments may be used to implement either or both of the pre-amplifier 1010 and the main amplifier 1030.

Figure 8B:
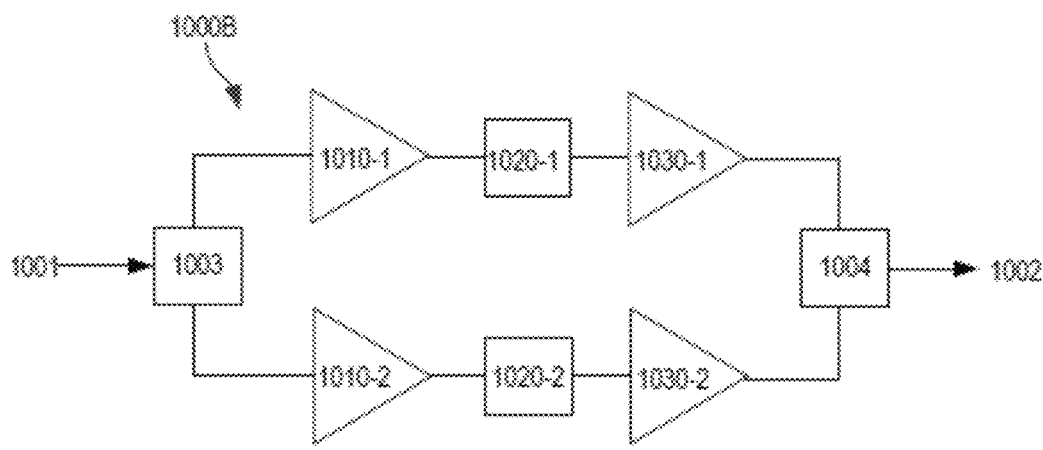

Referring to FIG. 8B, an RF transistor amplifier 1000B is schematically illustrated that includes an RF input 1001, a pair of pre-amplifiers 1010-1, 1010-2, a pair of inter-stage impedance matching networks 1020-1, 1020-2, a pair of main amplifiers 1030-1, 1030-2, and an RF output 1002. A splitter 1003 and a combiner 1004 are also provided. Pre-amplifier 1010-1 and main amplifier 1030-1 (which are electrically connected in series) are arranged electrically in parallel with pre-amplifier 1010-2 and main amplifier 1030-2 (which are electrically connected in series). As with the RF transistor amplifier 1000A of FIG. 8A, RF transistor amplifier 1000B may further include an input matching network that is interposed between RF input 1001 and pre-amplifiers 1010-1, 1010-2, and/or an output matching network that is interposed between the main amplifiers 1030-1, 1030-2 and the RF output 1002.

Figure 8C:
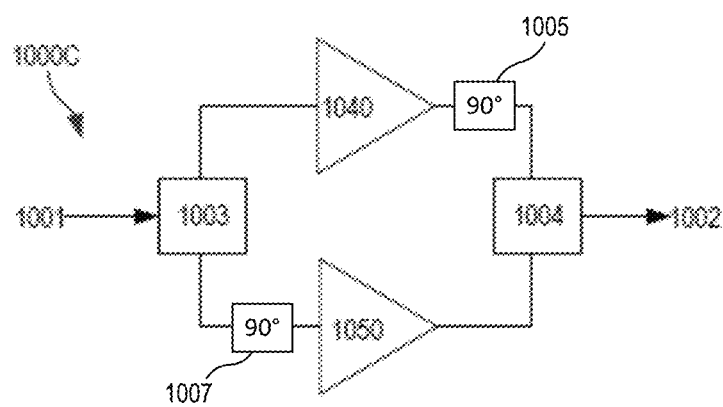

As shown in FIG. 8C, the RF transistor amplifiers according to some embodiments may also be used to implement Doherty amplifiers. As is known in the art, a Doherty amplifier circuit includes first and second (or more) power-combined amplifiers. The first amplifier is referred to as the "main" or "carrier" amplifier and the second amplifier is referred to as the "peaking" amplifier. The two amplifiers may be biased differently. For example, the main amplifier may comprise a Class AB or a Class B amplifier while the peaking amplifier may be a Class C amplifier in one common Doherty amplifier implementation. The Doherty amplifier may operate more efficiently than balanced amplifiers when operating at power levels that are backed off from saturation. An RF signal input to a Doherty amplifier is split (e.g., using a quadrature coupler), and the outputs of the two amplifiers are combined. The main amplifier is configured to turn on first (i.e., at lower input power levels) and hence only the main amplifier will operate at lower power levels. As the input power level is increased towards saturation, the peaking amplifier turns on and the input RF signal is split between the main and peaking amplifiers.

As shown in FIG. 8C, the Doherty RF transistor amplifier 1000C includes an RF input 1001, an input splitter 1003, a main amplifier 1040, a peaking amplifier 1050, an output combiner 1004 and an RF output 1002. The Doherty RF transistor amplifier 1000C includes a 90° transformer 1007 at the input of the peaking amplifier 1050 and a 90° transformer 1005 at the input of the main amplifier 1040, and may optionally include input matching networks and/or an output matching networks (not shown). The main amplifier 1040 and/or the peaking amplifier 1050 may be implemented using any of the above-described RF transistor amplifiers according to embodiments.

The RF transistor amplifiers according to embodiments may be formed as discrete devices, or may be formed as part of a Monolithic Microwave Integrated Circuit (MMIC). A MMIC refers to an integrated circuit that operates on radio and/or microwave frequency signals in which all of the circuitry for a particular function is integrated into a single semiconductor chip. An example MMIC device is a transistor amplifier that includes associated matching circuits, feed networks and the like that are all implemented on a common substrate. MMIC transistor amplifiers typically include a plurality of unit cell HEMT transistors that are connected in parallel.

Many variations of the features of the above embodiments are possible. Transistor structures with features that may be used in embodiments of the present invention are disclosed in the following commonly assigned publications, the contents of each of which are fully incorporated by reference herein in their entirety: U.S. Pat. No. 6,849,882 to Chavarkar et al. and entitled "Group-Ill Nitride Based High Electron Mobility Transistor (HEMT) With Barrier/Spacer Layer"; U.S. Pat. No. 7,230,284 to Parikh et al. and entitled "Insulating Gate AlGaN/GaN HEMT"; U.S. Pat. No. 7,501,669 to Parikh et al. and entitled "Wide Bandgap Transistor Devices With Field Plates"; U.S. Pat. No. 7,126,426 to Mishra et al. and entitled "Cascode Amplifier Structures Including Wide Bandgap Field Effect Transistor With Field Plates"; U.S. Pat. No. 7,550,783 to Wu et al. and entitled "Wide Bandgap HEMTs With Source Connected Field Plates"; U.S. Pat. No. 7,573,078 to Wu et al. and entitled "Wide Bandgap Transistors With Multiple Field Plates"; U.S. Pat. Pub. No. 2005/0253167 to Wu et al. and entitled "Wide Bandgap Field Effect Transistors With Source Connected Field Plates"; U.S. Pat. Pub. No. 2006/0202272 to Wu et al. and entitled "Wide Bandgap Transistors With Gate-Source Field Plates"; U.S. Pat. Pub. No. 2008/0128752 to Wu and entitled "GaN Based HEMTs With Buried Field Plates"; U.S. Pat. Pub. No. 2010/0276698 to Moore et al. and entitled "Gate Electrodes For Millimeter-Wave Operation and Methods of Fabrication; U.S. Pat. Pub. No. 2012/0049973 to Smith, Jr. et al. and entitled "High Power Gallium Nitride Field Effect Transistor Switches"; U.S. Pat. Pub. No. 2012/0194276 to Fisher and entitled "Low Noise Amplifiers Including Group III Nitride Based High Electron Mobility Transistors"; and U.S. Pat. No. 9,847,411 to Sriram et al. entitled "Recessed field plate transistor structures."

Although embodiments of the inventive concepts have been described in considerable detail with reference to certain configurations thereof, other versions are possible. The field plates and gates can also have many different shapes and can be connected to the source contact in many different ways. Accordingly, the spirit and scope of the invention should not be limited to the specific embodiments described above.

What is claimed is:

1. A transistor device, comprising:
a first unit subcell comprising:
a first active region having a first active region width extending in a first direction;
a first source contact in the first active region extending in the first direction;
a drain contact in the first active region extending in the first direction, wherein the drain contact is spaced apart from the first source contact in a second direction perpendicular to the first direction, and the first source contact and the drain contact defining a first channel region in the first active region between the first source contact and the drain contact, the first channel region configured to permit current flow between the first source contact and the drain contact in the second direction, wherein the drain contact extends outside the active region; and
a first gate contact between the first source contact and the drain contact; and
a second unit subcell arranged adjacent the first unit subcell in the first direction, the second unit subcell comprising:
a second active region having a second active region width extending in the first direction, wherein the drain contact extends into the second active region;
a second source contact in the second active region and extending in the first direction;
a second gate contact between the second source contact and the drain contact, the second source contact and the drain contact defining a second channel region in the second active region between the second source contact and the drain contact, the second channel region configured to permit current flow between the second source contact and the drain contact in the second direction; and
a first field plate in the first channel region, wherein the first field plate is connected to the first source contact outside the first active region without crossing over the first gate contact.

2. The transistor device of claim 1, wherein the first unit subcell and the second unit subcell are aligned in the first direction.

3. The transistor device of claim 1, further comprising a second field plate in the second channel region, wherein the second field plate is connected to the second source contact outside the second active region without crossing over the second gate contact.

4. The transistor device of claim 1, further comprising a plurality of pairs of first and second unit subcells, wherein the plurality of pairs of first and second unit subcells are spaced apart in the second direction.

5. The transistor device of claim 4, wherein each of the unit subcells in the plurality of pairs of first and second unit subcells of the transistor device has a gate finger width of less than 200 microns, and wherein the transistor device is capable of achieving a linear power density relative to the second direction of greater than 40 W/mm at an operating frequency of 10 GHz.

6. The transistor device of claim 5, wherein the transistor device is capable of achieving a linear power density relative to the second direction of greater than 45 W/mm.

7. The transistor device of claim 5, wherein the transistor device is capable of achieving a linear power density relative to the second direction of greater than 50 W/mm.

8. The transistor device of claim 5, wherein the transistor device is capable of achieving a gain of greater than 10 dB at an operating frequency of 10 GHz while achieving a linear power density relative to the second direction of greater than 40 W/mm.

9. The transistor device of claim 5, wherein the transistor device is capable of achieving a gain of greater than 13 dB at an operating frequency of 10 GHz while achieving a linear power density relative to the second direction of greater than 40 W/mm.

10. The transistor device of claim 1, wherein the transistor device comprises a gallium nitride based high electron mobility transistor device.

11. The transistor device of claim 1, wherein the first unit subcell comprises:
 a semiconductor epitaxial layer structure including a channel layer and a barrier layer on the channel layer, wherein the barrier layer has a higher bandgap than the channel layer, and wherein the first source contact and the drain contact are on the barrier layer;
 a first insulating layer on the barrier layer between the first source contact and the drain contact, wherein the first gate contact is on the first insulating layer.

12. The transistor device of claim 11, wherein the first gate contact comprises a central portion that extends through the first insulating layer and contacts the barrier layer, and a drain side wing that extends laterally from the central portion of the gate toward the drain contact by a distance $\Gamma_D$, wherein the drain side wing of the first gate contact is spaced apart from the barrier layer by a distance d1 that is equal to a thickness of the first insulating layer, wherein the distance $\Gamma_D$ is less than about 0.3 μm, and the distance d1 is less than about 80 nm.

13. The transistor device of claim 12, wherein the distance $\Gamma_D$ is between about 0.1 μm and 0.3 μm, and wherein the distance d1 is between about 60 nm and 80 nm.

14. The transistor device of claim 12, wherein the barrier layer comprises AlGaN with an aluminum concentration greater than 20% and a thickness of less than 25 nm.

15. The transistor device of claim 12, wherein the distance $\Gamma_D$ is about 0.2 μm and the distance d1 is about 70 nm.

16. The transistor device of claim 12, wherein a distance $L_{GS}$ between the central portion of the first gate contact and the first source contact is between about 0.8 μm and 1.2 μm.

17. The transistor device of claim 12, wherein a distance $L_{GD}$ between the central portion of the first gate contact and the first drain contact is between about 3.2 μm and 3.8 μm.

18. The transistor device of claim 12, wherein the first gate contact comprises a source side wing that extends laterally from the central portion of the gate toward the drain contact by a distance I's, where I's is less than about 0.3 μm.

19. The transistor device of claim 18, wherein I's is less than ID.

20. The transistor device of claim 12, wherein the central portion of the first gate contact has a width of about 200 nm to 300 nm at an interface with the barrier layer.

21. The transistor device of claim 11, further comprising a substrate, wherein the semiconductor epitaxial layer structure is formed on the substrate, wherein the substrate comprises silicon carbide and has a thickness of less than about 100 μm.

22. The transistor device of claim 11, wherein the first field plate includes a central portion that is spaced apart from the barrier layer by a distance d2, wherein d2 is less than 250 nm.

23. The transistor device of claim 22, wherein d2 is between 190 nm and 230 nm.

24. The transistor device of claim 22, wherein the first field plate is laterally spaced apart from the first gate contact by a distance TT-FP2, wherein TT-FP2 is between about 0.3 μm and 0.5 μm.

25. The transistor device of claim 11, wherein the first field plate comprises a central field plate portion, a source side field plate wing extending away from the central field plate portion toward the first source contact and a drain side field plate wing extending away from the central field plate portion toward the drain contact, wherein the source side field plate wing and the drain side field plate wing are spaced apart from the barrier layer by a distance d3 that is between about 250 nm and 310 nm.

26. A gallium nitride based transistor device, comprising:
 a plurality of pairs of unit subcells, the unit subcells of each pair of unit subcells having gate fingers aligned in a first direction, wherein the plurality of pairs of unit subcells are spaced apart in a second direction that is perpendicular to the first direction;
 wherein each of the unit subcells of the transistor device has a gate finger width less than 200 microns; and
 wherein the transistor device is capable of achieving a linear power density relative to the second direction of greater than 40 W/mm at an operating frequency of 10 GHZ, wherein each pair of unit subcells comprises:
 a first unit subcell comprising:
 a first active region having a first active region width extending in the first direction;
 a first source contact in the first active region extending in the first direction;
 a drain contact in the first active region and extending in the first direction, the first source contact and the drain contact defining a first channel region in the first active region between the first source contact and the drain contact, the first channel region configured to permit current flow between the first source contact and the drain contact in the second direction, wherein the drain contact extends outside the active region; and
 a first gate finger between the first source contact and the drain contact, wherein the first gate finger extends in the first direction and is configured to modulate a conductivity of the first channel region in response to a gate voltage; and
 a second unit subcell arranged adjacent the first unit subcell in the first direction, the second unit subcell comprising:
 a second active region having a second active region width extending in the first direction, wherein the drain contact extends into the second active region;
 a second source contact in the second active region and extending in the first direction, the second source contact and the drain contact defining a second channel region in the second active region between the second source contact and the drain contact, the second channel region configured to permit current flow between the second source contact and the drain contact in the second direction;
 a second gate finger between the second source contact and the drain contact, wherein the second gate finger extends in the first direction and is configured to modulate a conductivity of the second channel region in response to the gate voltage; and
 a first field plate in the first channel region, wherein the first field plate is connected to the first source contact outside the first active region without crossing over the first gate finger.

27. The gallium nitride based transistor device of claim 26, wherein the transistor device is capable of achieving a linear power density relative to the second direction of greater than 45 W/mm.

28. The gallium nitride based transistor device of claim 26, wherein the transistor device is capable of achieving a linear power density relative to the second direction of greater than 50 W/mm.

29. The gallium nitride based transistor device of claim 26, wherein the transistor device is capable of achieving a gain of greater than 10 dB at an operating frequency of 10

GHz while achieving a linear power density relative to the second direction of greater than 40 W/mm.

30. The gallium nitride based transistor device of claim 26, wherein the transistor device is capable of achieving a gain of greater than 13 dB at an operating frequency of 10 GHz while achieving a linear power density relative to the second direction of greater than 40 W/mm.

31. The gallium nitride based transistor device of claim 26, further comprising:
a second field plate in the second channel region, wherein the second field plate is connected to the second source contact outside the second active region without crossing over the second gate finger.

* * * * *